United States Patent

Roither et al.

[11] Patent Number: 6,124,739
[45] Date of Patent: Sep. 26, 2000

[54] MONOLITHICALLY INTEGRATED SIGNAL PROCESSING CIRCUIT

[75] Inventors: Gerhard Roither, München; Günther Hackl, Altotting; Uwe Fischer, Unterhaching, all of Germany

[73] Assignee: STMicroelectronics GmbH, Grasbrunn, Germany

[21] Appl. No.: 08/989,442

[22] Filed: Dec. 19, 1997

[30] Foreign Application Priority Data

Dec. 19, 1996 [DE] Germany ............................ 196 53 192

[51] Int. Cl.[7] .................................................. H03K 17/00
[52] U.S. Cl. .............................. 327/100; 327/94; 327/114
[58] Field of Search ................................... 327/100, 114, 327/113, 94, 558

[56] References Cited

U.S. PATENT DOCUMENTS

| | | | |
|---|---|---|---|
| 4,237,390 | 12/1980 | Buurma | 327/77 |
| 4,439,693 | 3/1984 | Lucas et al. | 327/95 |
| 4,521,750 | 6/1985 | Fukushima et al. | 333/28 R |
| 4,580,103 | 4/1986 | Tompsett | 330/9 |
| 4,637,003 | 1/1987 | Yokogawa | 369/32 |
| 5,187,390 | 2/1993 | Scott, III | 327/91 |
| 5,406,232 | 4/1995 | Hashimoto et al. | 331/113 R |
| 5,506,526 | 4/1996 | Seesink | 327/91 |
| 5,548,242 | 8/1996 | Yasuda et al. | 327/559 |
| 5,644,257 | 7/1997 | Kerth et al. | 327/96 |
| 5,699,063 | 12/1997 | Takayama | 341/118 |

FOREIGN PATENT DOCUMENTS

WO 91/19355  12/1991  WIPO .

*Primary Examiner*—Timothy R. Callahan
*Assistant Examiner*—Hai L. Nguyen
*Attorney, Agent, or Firm*—Theodore E. Galanthay; David V. Carlson; SEED IP Law Group LLP

[57] ABSTRACT

A monolithically integrated signal processing circuit comprising a signal series branch connected between a signal input terminal and a signal output terminal; a reference potential terminal; a series capacitor inserted in serial manner in the signal series branch and having a parasitic capacitance acting like a capacitor that is connected between a first electrode of the series capacitor directed towards the signal input terminal and the reference voltage terminal; and a first parallel capacitor connected between the first electrode of the series capacitor and the reference potential terminal; with the first parallel capacitor being constituted at least in part by the parasitic capacitance.

15 Claims, 2 Drawing Sheets

MONOLITHICALLY INTEGRATED SIGNAL PROCESSING CIRCUIT

TECHNICAL FIELD

The invention relates to a monolithically integrated signal processing circuit.

Examples for the utilization of such a signal processing circuit are a low-pass filter or an analog-signal to square-wave-signal reshaping circuit with offset compensation

BACKGROUND OF THE INVENTION

For realizing a capacitor in a monolithically integrated signal processing circuit, there is required a certain chip area the size of which is dependent upon the capacitance of the capacitor to be realized. The higher the desired capacitance is, the larger is the required chip area.

Monolithically integrated semiconductor circuits nowadays have reached a very high degree of integration per chip. Due to the fact that the circuits to be accommodated on one chip become ever more complex and comprehensive, everyone tries to achieve a reduction of the required chip area at all locations throughout an integrated semiconductor circuit.

In case of a conventional analog-signal to square-wave-signal reshaping circuit with offset compensation, in which a parasitic capacitance of a series capacitor is not utilized in the manner according to the invention, the side of the series capacitor directed towards a signal input terminal is connected via a first changeover switch either to the signal input terminal or to a parallel capacitor. The parallel capacitor, which constitutes a first parallel capacitor, has a second parallel capacitor connected in parallel thereto, which via a second changeover switch is connected either to the signal input terminal or the first parallel capacitor.

Switches that are monolithically integrated in semiconductor circuits are formed by electronic switching components, mostly in the form of switching transistors which may be MOS transistors. While an ON/OFF switch can be composed with one such switching transistor, a changeover switch requires two such switching transistors. A changeover switch thus needs at least twice the chip area as an ON/OFF switch.

SUMMARY OF THE INVENTION

It is an object of the invention to reduce the required chip area in a monolithically integrated signal processing circuit and in particular to develop the known signal processing circuit designed as an analog-signal to square-wave-signal reshaping circuit, in such a manner that the parasitic capacitance of the series capacitor can be utilized for the parallel capacitor.

The object of the invention is achieved by a signal processing circuit as indicated in the claims appended hereto.

With the manufacturing technology that is common for the monolithic integration of capacitors, each series capacitor is formed, which in addition to a desired capacitance, has a parasitic capacitance. This phenomenon, which generally has a disturbing effect, is advantageously utilized in accordance with the present invention for reducing the chip area.

In a series capacitor as provided in the signal processing circuit according to the invention, a parasitic capacitance results that acts like a capacitor which is connected between an electrode of the series capacitor and a reference potential terminal constituting in general a ground terminal. According to the invention, the parallel capacitor is accommodated in the signal processing circuit such that it is parallel to the parasitic capacitance of the series capacitor. By this configuration, the parasitic capacitance of the series capacitor can be utilized for the parallel capacitor such that the required parallel capacitance is constituted at least in part by the parasitic capacitance of the series capacitor. This means that the capacitance of the parallel capacitor can properly be reduced by the amount of the parasitic capacitance. In applications in which the capacitance necessary for the parallel capacitor is in the order of magnitude of the parasitic capacitance, the parallel capacitor can be formed completely by the parasitic capacitance.

In case of the circuit according to the invention, the capacitance of the parallel capacitor can thus be reduced or can even be dispensed with completely, which results in a corresponding reduction of the required chip area as compared to such circuits in which the parasitic capacitance of the series capacitor is not utilized.

In one embodiment, the first parallel capacitor is connected directly in parallel to the parasitic capacitance of the series capacitor, such that an electrode of the series capacitor directed towards a signal input terminal and an electrode of the first parallel capacitor directed towards a signal series branch are connected to each other in a circuit node. Between this circuit node and an electrode of the second parallel capacitor directed towards the signal series branch, there is connected a first ON/OFF switch which in the conducting state connects the two parallel capacitors in parallel. Between the circuit node and the signal input terminal, there is connected a second ON/OFF switch which in the conducting state connects the signal input terminal to the series capacitor.

Due to the fact that both the first and the second changeover switches of the already existing circuit, as shown in FIG. 2, have been replaced in a circuit, as shown in FIG. 1, according to the invention by one ON/OFF switch each, in such a circuit configuration which permits the utilization of the parasitic capacitance of the series capacitor for the first parallel capacitor, the circuit according to the invention can achieve considerable savings of chip area in comparison with the already existing circuit.

The invention will now be elucidated in more detail by way of non-limitative embodiments shown in the appended drawings.

DETAILED DESCRIPTION OF THE INVENTION

Figure 2:
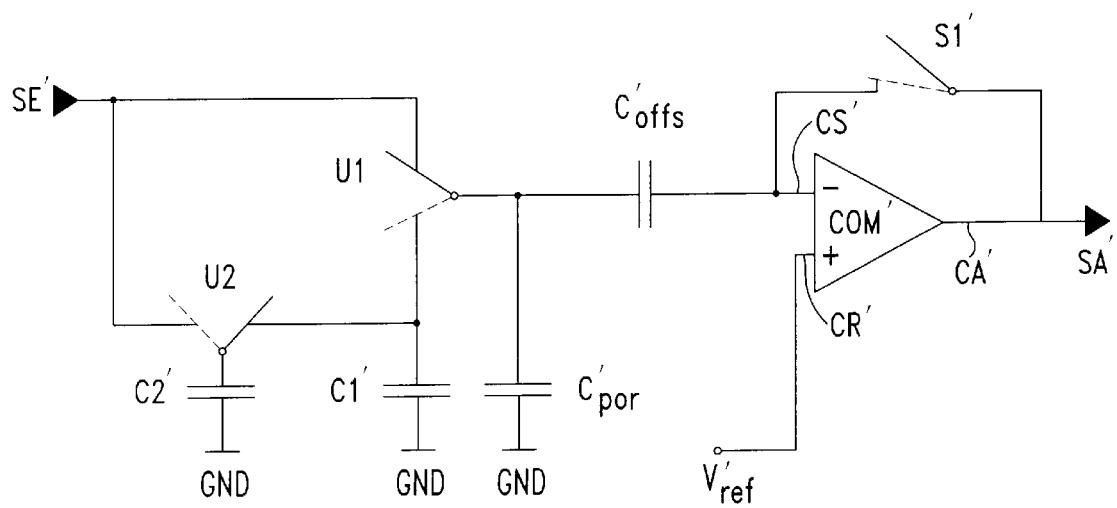
FIG. 2 shows an analog-signal to square-wave-signal reshaping circuit of the already existing type.

At first, an analog-signal to square-wave signal reshaping circuit already existing before the present invention and as shown in FIG. 2 will be considered. This circuit comprises a signal input SE which is fed with an analog signal $V_{AS}$, for example of the type shown in FIG. 3. Between a signal input SE' and a signal output SA' of this analog-signal to square-wave-signal reshaping circuit there are provided, in series connection, an offset storage capacitor $C'_{offs}$ arranged as series capacitor, and a comparator COM' by means of which threshold-dependent reshaping of an analog signal supplied to the signal input SE' to a square-wave signal is carried out. A first electrode of series capacitor $C'_{offs}$ that is directed towards signal input SE' is connectable via a first changeover switch U1 either to the signal input SE' or to a first parallel capacitor C1' whose side remote from U1 is connected to a ground terminal GND serving as a reference potential terminal. The first parallel capacitor C1' has a second parallel capacitor C2' connected in parallel thereto, which via a second changeover switch U2 is connectable either to the signal input SE' or to an electrode of first parallel capacitor C1' directed towards first changeover switch U1. An electrode of C2' remote from U2 is also connected to the ground terminal GND.

The series capacitor $C'_{offs}$ has a parasitic capacitance $C'_{par}$ shown in FIG. 2 in broken lines and acting like a capacitor connected between a first electrode of $C'_{offs}$ and the ground terminal GND.

The comparator COM' comprises a comparator signal input CS', a comparator reference voltage input CR' and a comparator output CA'. CS' and CA' are connected to each other via an ON/OFF switch S1' which, in the conducting state, effects feedback of the comparator output CA' to the comparator signal input CS'. The comparator reference voltage input CR' has a reference voltage source V'ref connected thereto, which for example is the so-called middle voltage, i.e., a d.c. voltage value of +2.5 volt for the usual case that the circuit shown in FIG. 2 is operated with a supply voltage of +5 V.

Figure 3:
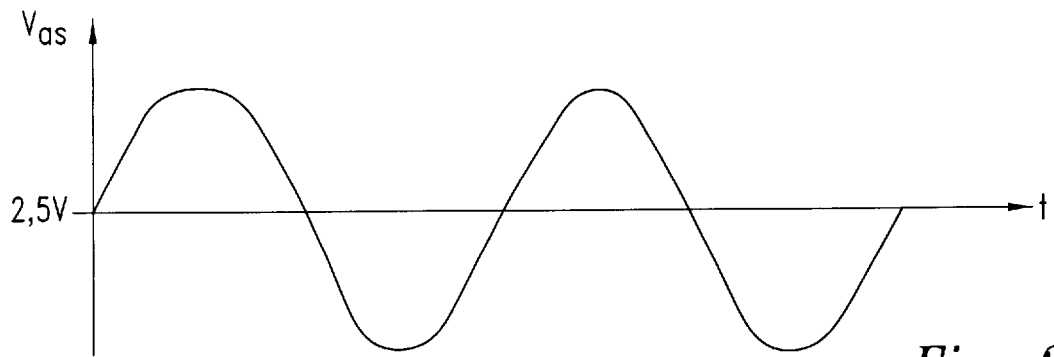
FIG. 3 shows an exemplary signal pattern of the analog signal fed to the analog-signal to square-wave-signal reshaping circuit of FIG. 1.

The circuit shown in FIG. 2 according to the prior art works as follows:

In a first phase, switches S1', U1 and U2 are in a switching state shown in continuous line, and in a second phase they are in a switching state shown in broken lines. In the first phase, the circuit is set for signal passage. An analog signal coming from the signal input SE', for example a signal of a type shown in FIG. 3, is passed via U1 and $C'_{offs}$ to the comparator signal input CS' and is reshaped by the comparator COM' to a square wave signal in threshold-dependent manner. The reshaping threshold is determined by a reference voltage V'ref fed to the non-inverting comparator reference voltage input CR'. The comparator reference voltage input CR' usually is at the middle voltage of, for example, +2.5 V. The signal series branch between SE' and SA' in the ideal case also has this middle voltage value.

Comparators usually have an offset voltage, which may be quite considerable in case of comparators designed in the MOS technology. This offset voltage results in an offset error which acts like a falsification of the reshaping threshold. This leads to shifting in time of the occurrence of the edges of the square wave signal arising at the comparator output CA'. In the circuit shown in FIG. 2, an offset compensation is achieved in that switch S1' is switched to a conducting state (shown in broken lines) during time window periods between adjacent pulse edges of the square wave signal occurring at the comparator output CA'. Due to the thus created feedback across the comparator COM', the same voltage values, namely +2.5 V would occur at CS', CR' and CA', if the comparator COM' were not offset-inflicted. Due to the offset error, the comparator signal input CS', while S1' is conducting, is higher than the voltage value of +2.5 V occurring at CS' by the offset voltage of the comparator COM'. When, during this phase of the circuit in FIG. 2, the electrode of $C'_{offs}$ directed towards signal input SE' is at the middle voltage of +2.5 V, and the offset voltage of the comparator COM' is created across the offset storage capacitor $C'_{offs}$. During the subsequent operation of the circuit in the first phase, in which $C'_{offs}$ is again connected via U1 to signal input SE', the offset voltage stored in $C'_{offs}$ is superimposed on the analog signal, and thus a correction corresponding to the offset voltage, i.e., an offset compensation, is carried out.

The following equations holds for the values of C1', C2' and $C'_{offs}$ in accordance with FIG. 2:

$$C1'>>C2'$$

$$C2' \approx C'_{offs}$$

During the second phase, in which changeover switches U1 and U2 have the switching state represented in broken lines, C2' is charged to the instantaneous value analogous signal voltage supplied via SE'. For this possible, the capacitance of C2' is selected to be correspondingly low. Due to its very much higher capacitance, C1' integrates a respective signal amplitude stored in C2' during the first phase, which U2 is in the switching state shown in relative line. C1' thus stores the d.c. voltage operating point occurring at the signal input SE'. During the second phase, in which $C'_{offs}$ stores the offset voltage of the comparator COM', the d.c. voltage operating point stored across C1' is present at the electrode of $C'_{offs}$ directed towards signal input SE'. This makes sure that really only the offset voltage value of comparator COM' is stored in $C'_{offs}$.

As the parasitic capacitance $C'_{par}$ usually is smaller than the capacitance of $C'_{offs}$ or is at the most in the same order of magnitude, thus $$C1'>>C'_{par}.$$

The $C'_{par}$ therefore cannot be used for C1'. Seen from the magnitude of the capacitance, the $C'_{par}$ indeed could be used for C2', which however is not possible, since C2' and $C'_{par}$ are not connected in parallel in the individual phases in any of the switching states of U1 and U2.

Figure 1:
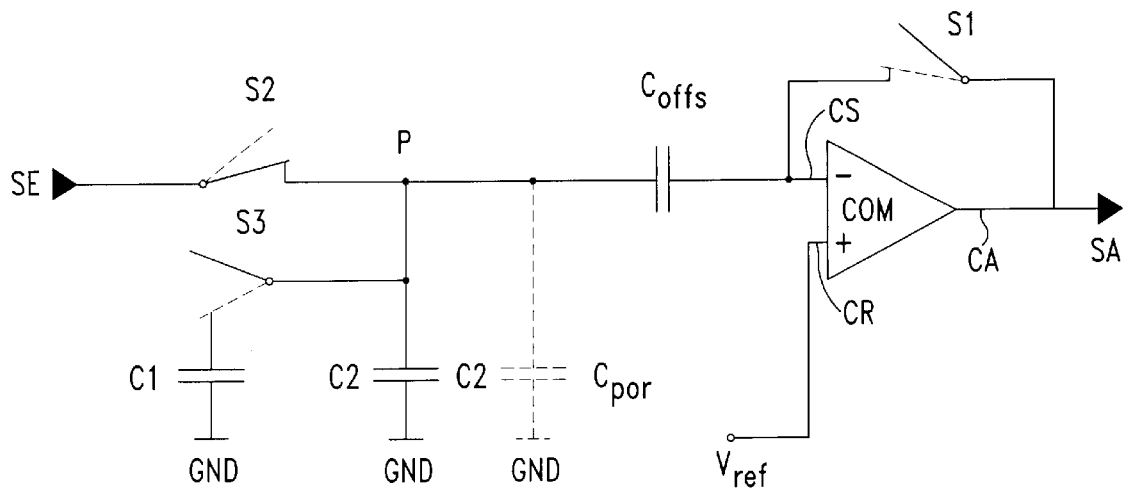
FIG. 1 shows a signal processing circuit according to the invention in the form of an analog-signal to square-wave-signal reshaping circuit.

The above-mentioned difficulty can be resolved by an analog-signal to square-wave-signal reshaping circuit designed according to the invention, as shown in FIG. 1. As regards the circuit part containing the comparator COM, switch S1 and offset storage capacitor $C_{offs}$, this circuit part is identical with the circuit shown in FIG. 2. A considerable difference is present with respect to the remainder of the circuit. The parallel capacitor C2 is permanently connected to a circuit node P, and thus to the electrode of an offset storage capacitor $C_{offs}$ directed towards a signal input SE. C2 and a parasitic capacitance $C_{par}$ of $C_{offs}$ thus are permanently arranged in parallel, and $C_{par}$ can be used for making available the capacitance of C2. As the capacitance of C2 and $C_{par}$ are in the same order of magnitude, the amount of the capacitance of C2 can be reduced by the amount of the capacitance of $C_{par}$ as compared to the case in which there is no parasitic capacitance. There may be applications in which C2 can be replaced completely by $C_{par}$. This reduction of the capacitance of C2 as compared to the circuit shown in FIG. 2 has the result that C2 requires correspondingly less space on the chip of the integrated circuit or, when C2 is replaced completely by $C_{par}$, the entire space requirement for C2 is eliminated.

Instead of the two changeover switches U1 and U2 in the circuit shown in FIG. 2, the circuit structure according to the invention, as shown in FIG. 1, is provided with two ON/OFF switches S2 and S3, between the signal input SE and the circuit node P, and between the circuit node P and the capacitor C1, respectively.

The relative dimensioning of C1, C2 and $C_{offs}$ is the same as indicated hereinbefore for FIG. 2.

In a first phase, in which signal passage is provided for between the signal input SE and the signal output SA, switches S1, S2, and S3 are in a switching state shown in full line, while they are in a switching state shown in broken lines in a second phase. In the first phase, S2 is thus rendered conducting, whereas S1 and S3 are rendered non-conducting. In the second phase, S1 and S3 are rendered conducting, whereas S2 is rendered non-conducting.

Figure 4:
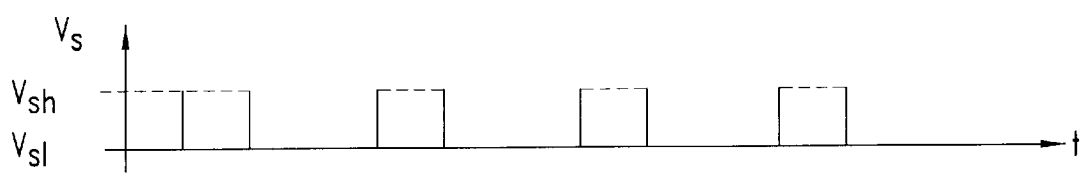
FIG. 4 shows a switch control signal.

By way of FIGS. 3 to 6, the mode of operation of the circuit shown in FIG. 1 will now be elucidated in more detail:

It is assumed again that a sinusoidal analog voltage VAS according to FIG. 3 is supplied to the signal input SE, whose middle value or d.c. voltage operating point is 2.5 V. FIG. 4 shows a switch control signal $V_S$. During the first phase which the switch control signal $V_S$ has a low potential value $V_{SL}$ shown in continuous line, switches S1, S2, and S3 are in the switching state shown in continuous line. During the second phase which $V_S$ assumes a high potential value $V_{SH}$ shown in broken lines, switches S1 to S3 are in the switching states represented in broken lines.

In the first phase, in which the switch S2 is rendered conducting, signal passage is provided for between the signal input SE and the signal output SA. In this phase, C2 is charged to the instantaneous amplitude value of the analog signal voltage $V_{AS}$ supplied via SE. Due to the fact that the switch S3 is rendered non-conducting, C1 and C2 are separated from each other during this phase. During this phase, the switch S1 is not rendered conducting, so that there is no feedback between CS and CA.

In the second phase, during which S1, S2, and S3 have the switching states shown in broken lines, the signal path between SE and SA is interrupted, C2 is connected in parallel to C1 and the comparator COM is fed back via S1. In this phase C1 integrates the amplitude value stored in C2, which the analog signal voltage VAS had at the time of opening S2, i.e., at the beginning of the second phase. Just as in the case of FIG. 2, C1 thus stores the d.c. voltage operating point of analog signal voltage $V_{AS}$. During the process of measuring the offset voltage of the comparator COM and storing of this offset voltage in the offset storage capacitor $C_{offs}$, the electrode of $C_{offs}$ directed towards the circuit node P thus is at the d.c. voltage operating point of $V_{AS}$. This is why only the offset voltage is stored in $C_{offs}$ in the case of FIG. 1 too.

Figure 5:
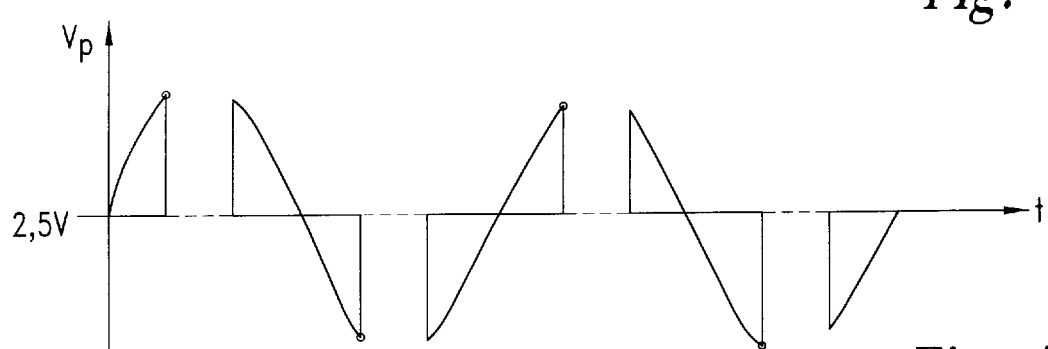
FIG. 5 shows the form of the analog signal at a switched circuit node of the circuit shown in FIG. 1.
Figure 6:
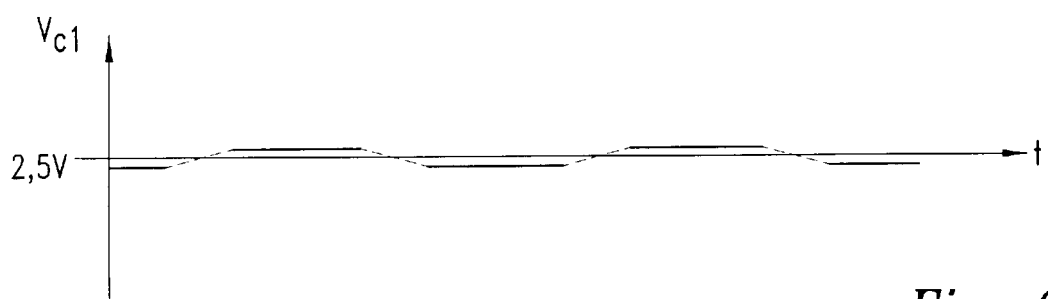
FIG. 6 shows the pattern of the voltage across the switched parallel capacitor of the circuit shown in FIG. 1.

FIG. 5 shows a voltage pattern $V_P$ of the analog signal voltage at the circuit node P. In this respect, the signal patterns shown in continuous lines belong to the first phases, i.e., the switch states drawn in continuous lines, whereas the portions in broken lines belong to the second phases, i.e., the switch states shown in broken lines in FIG. 1. It is assumed in this respect in simplified manner that the amplitude value of $V_P$ returns during the second phases to the middle value or d.c. voltage operating point of 2.5 V. Strictly speaking, this is not completely true, as illustrated by way of FIG. 6. Due to the fact that capacitor C2, during each transition from phase 1 to phase 2, is charged to the amplitude value of $V_{AS}$ present at that time, namely to voltage values marked in FIG. 5 by small circles, the integration voltage across capacitor C1 changes during the respective second phase. This is shown in FIG. 6 in the form of ascending and descending edges in broken lines. When the pattern $V_P$ has a positive amplitude value at the end of the first phase, voltage $V_{C1}$ shown in FIG. 6 rises during the subsequent second phase. When the voltage pattern $V_P$ had a negative amplitude value at the end of the respective first phase, the voltage value $V_{C1}$ across C1 drops during the respective subsequent second phase. Thus, stored across the capacitor C1 is substantially the d.c. voltage operating point or the middle voltage of 2.5 V, with slight fluctuations above and below this middle value of 2.5 V. Thus, virtually the middle voltage of 2.5 V is present at the electrode of the offset storage capacitor $C_{offs}$ directed towards the circuit node P, so that the voltage stored in $C_{offs}$ virtually represents the offset voltage of the comparator COM.

The circuit according to the invention as shown in FIG. 1 thus, in contrast to the already existing circuit shown in FIG. 2, can make do with two ON/OFF switches. In addition thereto, the capacitance of C2 may be lower by the value of the parasitic capacitance $C_{par}$ as compared to the case of FIG. 2. In the event of the parasitic capacitance $C_{par}$ is sufficient for the purpose of storing the respective amplitude value, C2 may be dispensed with completely. In this manner, the effect is achieved that chip area can be saved on the one hand by reduction or deletion of the capacitance of the capacitor C2 and on the other hand by using ON/OFF switches instead of changeover switches.

From the foregoing it will be appreciated that, although specific embodiments of the invention have been described herein for purposes of illustration, various modifications may be made without departing from the spirit and scope of the invention. Accordingly, the invention is not limited except as by the appended claims.

We claim:

1. A monolithically integrated signal processing, circuit, comprising:

a signal series branch connected between a signal input terminal and a signal output terminal;

a reference potential terminal;

a series capacitor inserted in serial manner in the signal series branch and having a parasitic capacitance acting like a capacitor that is connected between a first electrode of the series capacitor directed towards the signal input terminal and the reference potential terminal;

a first parallel capacitor connected directly between the first electrode of the series capacitor and the reference potential terminal with the first parallel capacitor being constituted at least in part by the parasitic capacitance;

wherein the first parallel capacitor is connected to the signal series branch at a circuit node;

between the signal input terminal and the circuit node, there is connected a first controllable ON/OFF switch which in the conducting state connects the circuit node to the signal input terminal;

between the circuit node and the reference potential terminal, there is connected a series connection comprising a second parallel capacitor and a second controllable ON/OFF switch, said second switch, when in the conducting state, connecting the second parallel capacitor in parallel to the first parallel capacitor;

between the series capacitor and the signal output terminal, there is connected an offset-inflicted comparator by means of which an analog signal can be reshaped to a square wave signal in threshold-dependent manner and which comprises a comparator signal input connected to the series capacitor, a comparator reference voltage input connected to a second reference potential terminal for connection to a threshold-determining reference potential, and a comparator output directed towards the signal output terminal; and between the comparator signal input and the comparator output, there is connected a controllable third switch which in the conducting state connects the comparator signal input and the comparator output to each other wherein the series capacitor serves as an offset storage capacitor;

during window periods lying between the occurrence of adjacent edges of the square wave signal, the first switch can be controlled to the non-conducting state and the second switch and the third switch can be controlled to the conducting state; and during the remaining time, the first switch can be controlled to the conducting state and the second switch and the third switch can be controlled to the non-conducting state.

2. The signal processing circuit of claim 1 wherein the first parallel capacitor is part of a low-pass filter.

3. The signal processing circuit of claim 1 wherein the capacitance of the second parallel capacitor is far higher than the capacitance of the first parallel capacitor and the series capacitor.

4. The signal processing circuit of claim 1 wherein the capacitances of series capacitor and first parallel capacitor are approximately the same.

5. A signal processing circuit comprising:

a reshaping circuit coupled between a signal input and a signal output of the signal processing circuit;

a first reference potential;

an offset storage circuit, said offset storage circuit having a parasitic capacitor connected between a first electrode of the offset storage circuit and the first reference potential and having a second electrode coupled to the reshaping circuit;

a first parallel capacitor connected between the first electrode of the offset storage circuit and the first reference potential, said first parallel capacitor being constituted at least in part by the parasitic capacitor;

a first controllable ON/OFF switch coupled between said signal input and said first electrode of said offset storage circuit;

a second parallel capacitor coupled to said first reference potential; and a second controllable ON/OFF switch coupled between said second parallel capacitor and said first electrode of the offset storage circuit.

6. The signal processing circuit of claim 5 wherein the capacitance of the second parallel capacitor is much larger than the capacitance of the first parallel capacitor.

7. The signal processing circuit of claim 6 wherein the capacitance of the first parallel capacitor is of approximately similar value with the capacitance of the parasitic capacitor.

8. The signal processing circuit of claim 5 wherein during a first switching state the first ON/OFF switch is conducting, the second ON/OFF switch and the switch circuit are non-conducting, and during a second switching state the first ON/OFF switch is non-conducting, the second ON/OFF switch and the switch circuit are conducting.

9. The signal processing circuit of claim 8 wherein said second switching state is provided during a time window period between the occurrence of adjacent edges of a square wave signal from the comparator output.

10. The signal processing circuit of claim 9 wherein the offset storage circuit stores an offset voltage during the second switching state.

11. The signal processing circuit of claim 8 wherein the second parallel capacitor stores a d. c. voltage operating point of an analog input signal.

12. The signal processing circuit of claim 8 wherein the first parallel capacitor stores an instantaneous value of the analog input signal.

13. A method for reshaping an analog-signal to a square-wave-signal by an electric circuit, said electric circuit having a comparator circuit, a feedback switch, a first and a second ON/OFF switches, a first and a second parallel capacitors, and an offset storage capacitor, said method comprising:

receiving an analog input signal into the electric circuit;

switching the first ON/OFF switch on to transmit the analog input signal to the comparator circuit, and switching the second ON/OFF switch and the feedback switch off;

storing an analog signal voltage in the first parallel capacitor;

superimposing an offset voltage present in the offset storage capacitor upon the analog input signal into the comparator circuit;

generating a pulse edge of the square wave signal by the comparator circuit when the analog input signal added together with the offset voltage reaches a threshold voltage value;

switching the first ON/OFF switch off and switching the second ON/OFF switch and the feedback switch on;

charging the offset storage capacitor through the feedback switch to establish an offset voltage;

superimposing an amplitude voltage value of the first parallel capacitor into the second parallel capacitor; and reflecting a d. c. voltage of the analog input signal stored in the second parallel capacitor into the offset storage capacitor.

14. The method of claim 13, further comprising:

generating a time window pulse after a predetermined delay of the pulse edge of the square wave signal; and providing the time window pulse into the electric circuit to render the feedback switch in the conducting state.

15. A monolithically integrated signal processing circuit, comprising:

a reshaping circuit coupled between a signal input and a signal output of the signal processing circuit;

a first reference potential;

an offset storage circuit, said offset storage circuit having a parasitic capacitor connected between a first electrode of the offset storage circuit and the first reference potential and having a second electrode coupled to the reshaping circuit;

a first parallel capacitor connected between the first electrode of the offset storage circuit and the first reference potential, said first parallel capacitor being constituted at least in part by the parasitic capacitor;

a first controllable ON/OFF switch coupled between said signal input and said first electrode of said offset storage circuit;

a second parallel capacitor coupled to said first reference potential; and a second controllable ON/OFF switch coupled between said second parallel capacitor and said first electrode of the offset storage circuit.

* * * * *